United States Patent [19]
Sakurai

[11] Patent Number: 4,853,654
[45] Date of Patent: Aug. 1, 1989

[54] MOS SEMICONDUCTOR CIRCUIT
[75] Inventor: Takayasu Sakurai, Tokyo, Japan
[73] Assignee: Kabushiki Kaisha Toshiba, Kawasaki, Japan
[21] Appl. No.: 72,443
[22] Filed: Jul. 13, 1987
[30] Foreign Application Priority Data
  Jul. 17, 1986 [JP] Japan .................. 61-168539
[51] Int. Cl.⁴ .................. H03B 5/00; H03B 5/24; H03L 1/00; H03L 1/02
[52] U.S. Cl. .................. 331/57; 331/175; 331/176
[58] Field of Search .................. 331/57, 111, 143, 175, 331/176

[56] References Cited
U.S. PATENT DOCUMENTS

| | | | |
|---|---|---|---|
| 3,641,370 | 2/1972 | Heimbigner | 307/269 |
| 4,388,536 | 6/1983 | Peil et al. | 307/268 |
| 4,451,742 | 5/1984 | Aswell | 331/57 X |
| 4,592,087 | 5/1986 | Killion | 381/68 |

FOREIGN PATENT DOCUMENTS 0086509 7/1981 Japan .................. 331/57

OTHER PUBLICATIONS

Patent Abstracts of Japan, vol. 9, No. 325 (E-368), [2048], Dec. 20, 1985; JP-A-60 158 717 (Seiko Denshi Kogyo K.K.), 8/20/85.
European Search Report, Appln. No. EP 87 11 0298.

Primary Examiner—David Mis
Attorney, Agent, or Firm—Finnegan, Henderson, Farabow, Garrett & Dunner

[57] ABSTRACT

An MOS semiconductor circuit includes cascade connected logical circuits. The MOS semiconductor circuit further includes an MOS transistor circuit having at least one first MOS transistor coupled between a source voltage terminal and the output node of the individual logical circuits, and a second MOS transistor, which has the same conductivity type as the first MOS transistor and has its gate and drain short-circuited, with this gate being coupled to the gate of the first MOS transistor. The MOS semiconductor circuit also includes a current control circuit, which is coupled to the drain of the second MOS transistor for providing a predetermined current between the source and drain of the second MOS transistor.

20 Claims, 10 Drawing Sheets

MOS SEMICONDUCTOR CIRCUIT

BACKGROUND OF THE INVENTION

This invention relates to an MOS semiconductor circuit.

A dynamic RAM (DRAM) needs a periodic refresh operation or data hold operation. Many of recent DRAMs automatically initiate a refresh operation when they are not accessed, i.e., when they are in a standby mode. This type of a RAM has a refresh timer provided on the same chip, and this refresh timer measures the time interval between refresh operations to regularly trigger the refresh operation. In general, the refresh timer is constructed using a ring oscillator.

Figure 1:
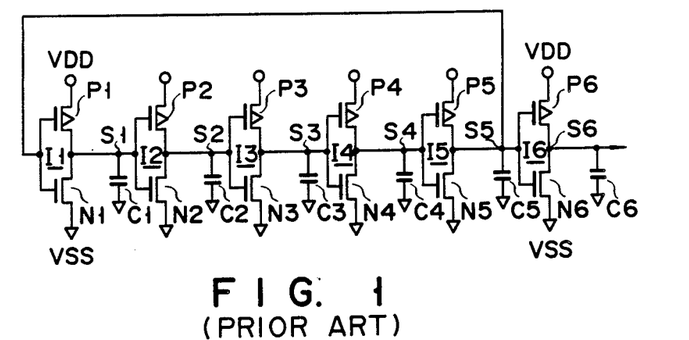
FIG. 1 is a circuit diagram of a conventional ring oscillator.

FIG. 1 illustrates a convention ring oscillator used as refresh timer.

The ring oscillator comprises six CMOS inverters 11 to I6 each having one of P-channel MOS transistors P1 to P6 coupled in series with a corresponding one of N-channel MOS transistors N1 to N6 between a power source terminal VDD of a high potential and a reference voltage terminal VSS (ground potential=0 V) of a low potential. The first five CMOS inverters I1 to I5 are coupled in ring, and the output of inverter I5 is coupled to the last CMOS inverter 16, which serves as a wave shaper. These inverters 11 to 16 have their respective output nodes S1 to S6 coupled to parasitic electrostatic capacitors C1 to C6, respectively.

When the ring oscillator is used as a refresh timer, its oscillation period is between, for example, 10 μs and 100 μs and its dissipation power determines the dissipation power of a DRAM in standby mode. Therefore, it is desirable to reduce the dissipation power of the ring oscillator itself as low as possible.

In the ring oscillator shown in FIG. 1, the constituents of each of the CMOS inverters coupled in ring, e.g., P-channel MOS transistor P1 and N-channel MOS transistor N1 of inverter 11 are designed to have a long channel length L so that these transistors each have a small conductance. For instance, their channel width W is about 2 μm while the channel length L is 200 μm. In contrast, transistors P6 and N6 constituting wave-shaping inverter 16 are designed to have a relatively large conductance; for instance, their channel width W is as wide as 100 μm. This wave-shaping inverter I6 drives another circuit (not shown) and electrostatic capacitor C6 coupled to its output node S6 has a capacitance as high as 5 pF.

The aforementioned ring oscillator is used not only as the refresh timer, but also in a base-plate bias circuit that provides a base-plate bias voltage on chip.

Figure 2:
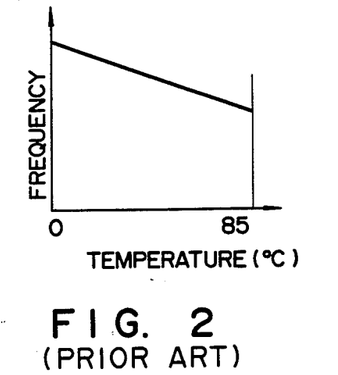
FIGS. 2 and 3 are diagrams respectively showing the relationship between the oscillation frequency of the ring oscillator of FIG. 1 and temperature and power source voltage.
Figure 3:
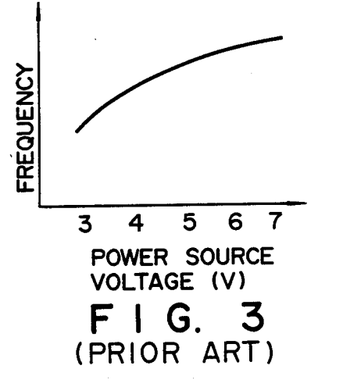

When the ring oscillator is used as a refresh timer, it is not desirable that its oscillation frequency easily varies with a change in the ambient temperature, the voltage in use, manufacturing processes, each the like. This is because as the oscillation frequency increases, the standby current also increases. FIGS. 2 and 3 respectively depict the temperature characteristic of the oscillation frequency and the dependency of the oscillation frequency on the power source voltage in the prior art ring oscillator. As indicated by the characteristic of FIG. 2, the oscillation frequency varies about 30–40% between 0° C. and 85° C. As should be clear from the characteristic curve of FIG. 3, the oscillation frequency also varies about 30% when the power source voltage VDD varies between 4 V and 6 V. In the memory cells of a DRAM, the leak current increases at high temperatures and the number of charges which can be accumulated in the memory cells decreases with a low power source voltage. Accordingly, the refresh timer requires such a characteristic that the oscillation frequency is high at high temperature and low power source voltage. However, the prior art refresh timer actually has the contrary characteristics as shown in FIGS. 2 and 3. Therefore, according to the prior art, the refresh timer is designed to have a minimum allowable frequency at high temperatures and low power source voltages in order to ensure data holding even at these temperature and voltage levels. Consequently, the refresh timer oscillates at a higher frequency at low temperatures and high power source voltages, thus significantly increasing the standby current. Although the refresh interval need not be short in these temperature and voltage conditions, the refresh operation is executed frequently and thus wastefully because the refresh timer oscillates at a high frequency. Further, the standby current increase by 140% (due to the temperature change) ×130% (due to the power source voltage change) of what is necessary and becomes about 180% of the proper amount, thus increasing the dissipated power. With variations in the manufacturing processes considered, the actual standby current may be two to three times the proper standby current.

Furthermore, since transistors P1 and N1 of inverter 11 have a long channel length L so as to have a small conductance, the area occupied by each inverter on an integrated chip is above 10000 μm², thus undesirably increasing the overall chip area.

The prior art circuit also has another shortcoming as follows.

Figure 4:
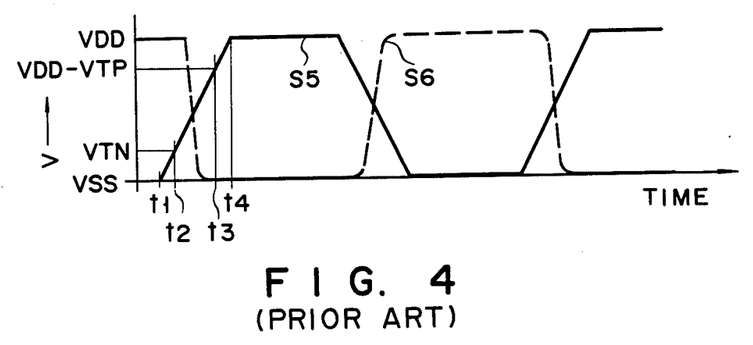
FIG. 4 is a waveform diagram for explaining the operation of the ring oscillator of FIG. 1.

FIG. 4 shows the waveforms of the output voltages at output nodes S5 and S6 of the respective inverters I5 and I6 of the ring oscillator shown in FIG. 1. The variation in the output voltage of inverter I5 at node S6 is considerably gentle as compared with the variation in the output voltage of inverter 16 at node S6. For instance, the time interval between t1 where the output voltage at node S5 is VSS and t2 where it is increased to the threshold voltage VTN of the N-channel MOS transistor, is 10 μs.

Denoting the threshold voltage of P-channel MOS transistor P6 of inverter 16 as VTP, the threshold voltage of N-channel MOS transistor N6 and VTN and the time where the voltage at node S5 increases to the level (VDD−VTP) from the level VTN at t3, both transistors P6 and N6 are ON between time t2 and t3. Consequently, a current path is formed between source voltage terminal VDD and reference voltage terminal VSS through transistors P6 and N6. As the change in the voltage at output node S6 of inverter 15 is gentle, the time period in which the current flows between the voltage terminals is long. Assume now that the maximum current flowing between the voltage terminals in the ring oscillator is 5 mA and the channel widths W of transistors N6 and P6 are 100 μm and 200 μm, respectively. Then, the average current flowing in inverter I6 is 50 μA, making it difficult to attain a low dissipation power due to the presence of inverter 16.

If the wave-shaping inverter 16 is omitted or the conductances of transistors P6 and N6 are reduced, the current path between the voltage terminals would disappear or the current would be reduced. However, in this case, the same phenomenon would in turn occur at the first stage of another circuit (not shown) which is driven by the output signal of inverter 16. Thus, the dissipation power cannot be reduced. Although inverter 11 is also driven by the output signal of inverter 16, its conductance is as low as 1/10000 of that of the wave-shaping inverter 16 so that the current flowing between voltage terminals of inverter 11 is negligible.

In short, the prior art circuit has some shortcomings such that the temperature and voltage characteristics cannot be flexibly set, the dissipation power and the chip area cannot be reduced as desired, and the oscillation frequency is not stable with respect to a change in temperature, voltage and manufacturing processes.

SUMMARY OF THE INVENTION

It is an object of this invention to provide a MOS semiconductor circuit whose operational characteristics are not greatly influenced by a variation in the operation temperature, power source voltage, or the like.

To achieve this object, the MOS semiconductor circuit of this invention comprises first and second voltage terminals; cascade-connected logical circuits; a first MOS transistor circuit having at least one MOS transistor coupled between the first voltage terminal and the output node of each of the logical circuits; a second MOS transistor having the same conductivity type as the first MOS transistor and having a source, a gate coupled to a gate of the first MOS transistor and a drain coupled to the gate of the second MOS transistor; and a current control circuit, coupled to the drain of the second MOS transistor, for providing a predetermined current between the source and rain of the second MOS transistor.

According to the MOS semiconductor circuit of this invention, the first and second MOS transistors constitute a current mirror circuit to control the current flowing in each of the individual logical circuits and the current control circuit is formed to have a proper characteristic, so that the individual logical circuits have the proper operation speed, temperature characteristic and power source voltage characteristic. With this arrangement, the semiconductor circuit is less influenced by variations in the manufacturing processes, and particularly, the circuit has reduced dissipation power and chip area and has a stable operation (stable oscillation frequency) even with a change in temperature, voltage or manufacturing processes.

DETAILED DESCRIPTION OF THE PREFERRED EMBODIMENTS

Embodiments of this invention will now be explained with reference to the accompanying drawings.

Figures 5, 6, 7, 8:
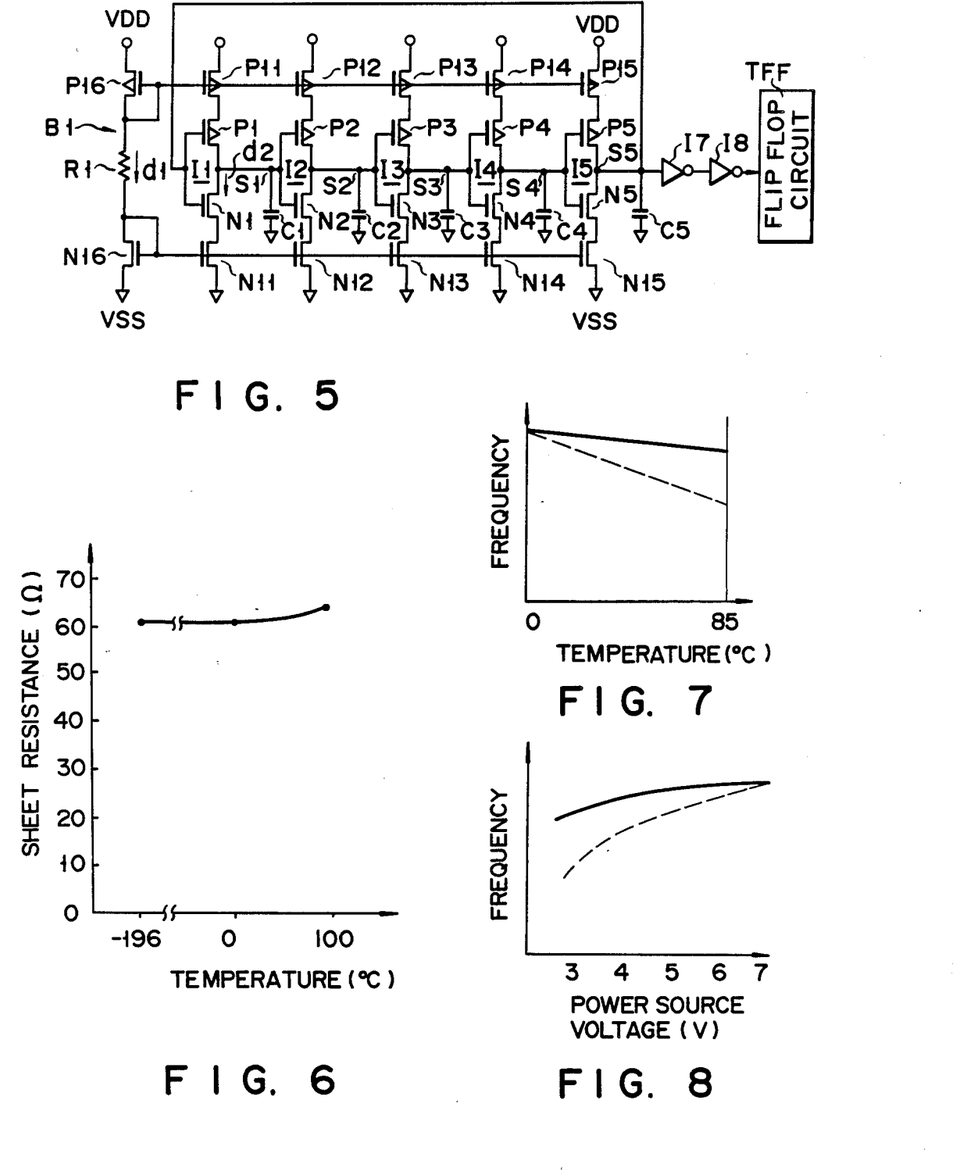
FIG. 5 is a circuit diagram of an MOS semiconductor circuit according to an embodiment of this invention.
FIG. 6 is a diagram showing the relationship between temperature and the sheet resistance of a polysilicon resistor used in the MOS semiconductor circuit of FIG. 5.
FIGS. 7 and 8 are diagrams respectively showing the relationship between the oscillation frequency of a ring oscillator used in the MOS semiconductor circuit of FIG. 5 and temperature and voltage.

FIG. 5 is a circuit diagram showing the first embodiment of this invention, in which a MOS semiconductor circuit of this invention is applied to a ring oscillator. For ease of understanding and simplicity, the reference numerals used in the prior art circuit of FIG. 1 are also used for corresponding parts of FIG. 5. In this embodiment, N-channel MOS transistors N11 to N15 are inserted between voltage terminal VSS and N-channel MOS transistors N1 to N5 of inverters I1 to I5, respectively. Similarly, P-channel MOS transistors P11 to P15 are inserted between voltage terminal VDD and P-channel MOS transistors P1 to P5 of inverters I1 to I5, respectively.

The gates of the five P-channel MOS transistors P11 to P15 are commonly coupled and are also coupled to the gate of another P-channel MOS transistor P16. P-channel MOS transistor P16 has its source coupled to voltage terminal VDD and its gate and drain short-circuited.

The gates of the five N-channel MOS transistors N11 to N16 are commonly coupled and are further coupled to the gate of another N-channel MOS transistor N16. N-channel MOS transistor N16 has its source coupled to voltage terminal VSS and its gate and drain short-circuited.

A resistor R1 formed of polysilicon is inserted between the drain of P-channel MOS transistor P16 and the drain of N-channel MOS transistor N16. The resistor R1 and two transistors P16 and N16 constitute a bias control circuit B1.

A signal at output node S5 of inverter 15 is supplied to a toggle flip-flop circuit TFF through two inverters 17 and 18 serving as buffers.

In FIG. 5, as described previously, the gate and drain of transistor P16 are short-circuited and this gate is further coupled to the gates of transistors P11 to P15, while the gate and drain of transistor N16 are similarly short-circuited and this gate is further coupled to the gates of transistors N11 to N15. This arrangement is known as a current mirror circuit. Because transistor N16 has the same bias condition between its gate and source as, for example, transistor N11, the same current would flow in transistors N11 and N16 when these transistors have the same channel length and the same channel width. Here, the bias current control means for transistor N16 is constituted by polysilicon resistor R1, and a current d1 determined by this resistor R1 equals a maximum current d2 of transistor N11. This current d2 causes discharging of electrostatic capacitor C1 coupled to output node S1.

The temperature dependency of the oscillation frequency will now be explained. The capacitance of electrostatic capacitor C1 is now greatly dependent on the temperature. Since current d1, which determines current d2 for discharging the charges accumulated in electrostatic capacitor C1, is determined by polysilicon resistor R1, current d2 is also now greatly dependent on the temperature. This is obvious from FIG. 6 that shows the temperature dependency of the sheet resistance of the polysilicon resistor. The polysilicon resistor is significantly stable against temperature change, and since the equivalent resistance of a transistor is determined by the amount of carriers moved, the variation of the polysilicon resistor is in a sharp contrast with one having a large temperature dependency. A diffusion resistor shows the same stability over temperature so that a diffusion resistor can be used instead of the polysilicon resistor. Since the sheet resistivity of a diffusion resistor is larger than that of a polysilicon resistor, the area required to obtain a high resistance is smaller than hat for the diffusion resistor. As a result, the time for discharging the charges built up in capacitor C1 shows a flatter temperature characteristic and the temperature dependency of the oscillation frequency is significantly improved as indicated by the solid line in FIG. 7, as compared with the conventional case which is indicated by the broken line in FIG. 7.

In the illustrated embodiment, toggle flip-flop circuit TFF is used to frequency-divided the output signal of inverter 15, thus ensuring the use of a lower oscillation frequency.

The dependency of the circuit on the power source-voltage will now be considered. The equivalent resistance of each transistor in the conventional circuit of FIG. 1 is proportional to source voltage VDD. Therefore, the amount of charges accumulated in each electrostatic capacitor C is proportional to power source voltage VDD, which means the discharging time of electrostatic capacitor C1 is inversely proportional to power source voltage VDD. In the FIG. 5 embodiment, however, the discharging time for each of electrostatic capacitors C1 to C5 does not depend on the equivalent resistances of transistors N1 to N5, but is instead proportional to current d1 flowing across resistor R1. Since this current d1 becomes a value obtained by subtracting threshold voltage VTP of P-channel MOS transistor P16 and threshold voltage VTN of N-channel MOS transistor N16 from the source voltage VDD and dividing the result by the resistance of resistor R1, the discharging time is proportional to (VDD - VTP - VTN). Assuming that threshold voltages VTP and VTN are sufficiently smaller than source voltage VDD, the discharge current and charges to be discharged are proportional to source voltage VDD. Accordingly, the discharging time is not greatly dependent on the source voltage, and neither is the oscillation frequency, whose stability is thus significantly improved as indicated by the solid line in FIG. 8, as compared with the conventional case indicated by the broken line in FIG. 8.

Figure 9:
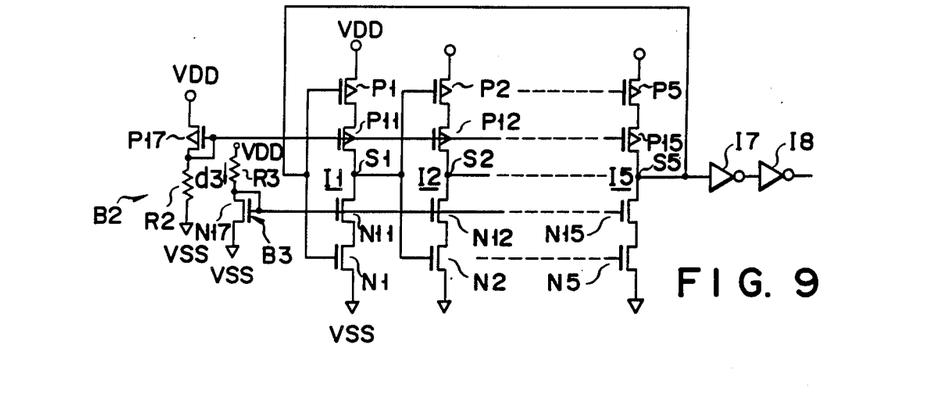
FIG. 9 is a circuit diagram of a MOS semiconductor circuit with a modified bias control circuit of the embodiment of FIG. 5.

FIG. 9 is a circuit diagram depicting the configuration of the second embodiment of this invention, which is designed to further reduce the source-voltage dependency. In the second embodiment, in place of bias control circuit B1 of the first embodiment, bias control circuits B2 and B3 are separately provided using P-channel MOS transistor P17 and N-channel MOS transistor N17, respectively. P-channel MOS transistor P17 has its gate and drain short-circuited and its source coupled to voltage terminal VDD, while N-channel MOS transistor N17 has its gate and drain short-circuited and its source coupled to voltage terminal VSS. In bias control circuit B2, a polysilicon resistor R2 is inserted as a bias current control means between the drain of P-channel MOS transistor P17 and voltage terminal VSS, the gate of P-channel MOS transistor P17 is coupled to the gates of P-channel MOS transistors P11 to P15. In bias control circuit B3, another polysilicon resistor R3 is provided, also as a bias current control means between the drain of N-channel MOS transistor N17 and voltage terminal VSS, and the gate of transistor N17 is coupled to the gates of N-channel MOS transistors N11 to N15.

Since each bias control circuit B2 or B3 includes only a single transistor and current d3 flowing across resistor R3 is proportional to (VDD−VTH), the discharging current and the amount of charges to be discharged are more closely proportional to power source voltage VDD than in the prior art circuit. However, since the same amount of current always flows through current contronl transistors P16 and N16 in the circuit of FIG. 5, the FIG. 5 circuit is advantageous in that inverters 11 to 15 have the same rising characteristic. In the embodiment shown in FIG. 9, the P-channel MOS transistors and the N-channel MOS transistors of each inverter, e.g., transistors P1 and P11 and transistors N1 and N11 of inverter 11 are provided in the reverse order of the circuit shown in FIG. 5. The circuit with this arrangement is substantially the same as the circuit of FIG. 5. It should be noted, however, that a current control N-channel MOS transistor is provided between voltage terminal VSS and each of output nodes S1 to S5 of inverters 11 to 15.

Since this invention aims at reducing the dissipation power, the aforementioned embodiments use CMOS devices having P-channel and N-channel MOS transistors. However, N-channel MOS transistors may replace the CMOS devices.

Figure 10:
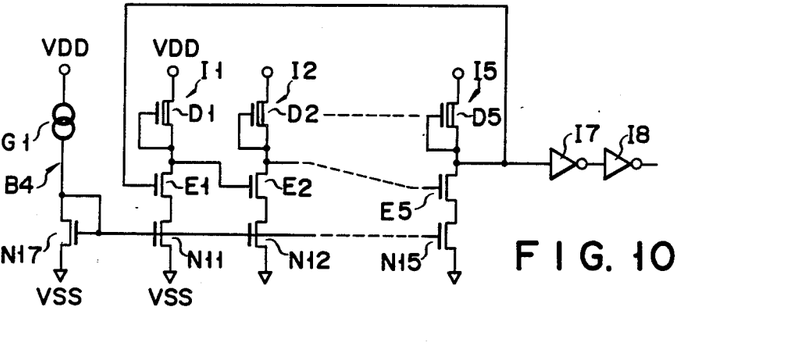
FIG. 10 is a circuit diagram of a MOS semiconductor circuit having a ring oscillator comprising N-channel MOS transistors.

FIG. 10 is a circuit diagram illustrating the configuration of the third embodiment of this invention in which the ring oscillator is comprised of N-channel MOS transistors. In this embodiment, each of inverters 11 to 15 is constituted by a depletion type N-channel MOS transistor D1, D2, . . . , or D5 having one end coupled to voltage terminal VDD, and an enhancement-type N-channel MOS transistor E1, E2, . . . , or E5 having one end coupled to the other end of the associated depletion-type N-channel MOS transistors. Enhancement-type N-channel MOS transistors N11 to N15 are provided between voltage terminal VSS and the other ends of MOS transistors E1 to E5, respectively. Bias control circuit B4 is constituted by N-channel MOS transistor N17 and current source G1. The reason for using current source G1 instead of resistor R1 in this embodiment is that the desired temperature characteristic or source-voltage dependency can be provided by selecting, as the current source, an element having a particular characteristic. For instance, using a diode as current source G1 provides an exponential temperature characteristic for the oscillation frequency.

Figure 11:
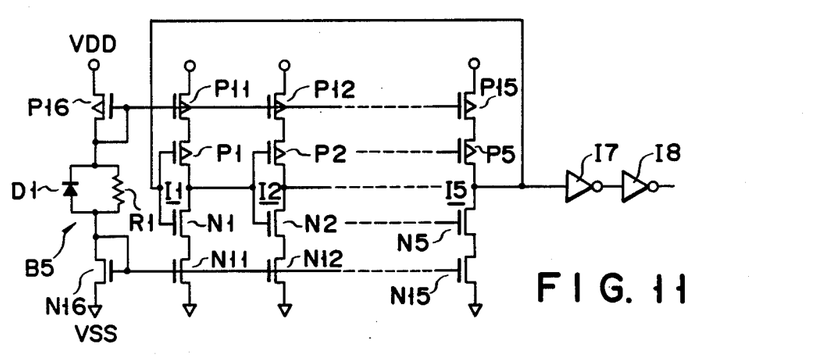
FIG. 11 is a circuit diagram of a MOS semiconductor circuit having a diode coupled in parallel with a resistor in the bias control circuit of the embodiment shown in FIG. 5.
Figure 12:
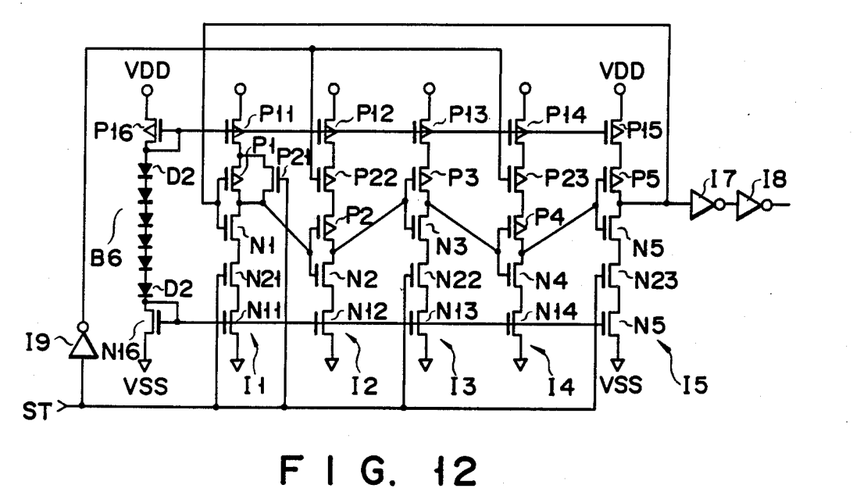
FIG. 12 is a circuit diagram of a MOS semiconductor circuit having series-connected diodes which replace the resistor in the bias control circuit of the embodiment shown in FIG. 5.

FIGS. 11 and 12 are circuit diagrams respectively showing the fourth and fifth embodiments of this invention, wherein a diode is used as current source G1. In FIG. 11, a diode D1 is coupled, in parallel but with the reverse polarity, to resistor R1 of bias control circuit B1 of the embodiment shown in FIG. 5, thus constituting bias control circuit B5.

In FIG. 12, a plurality of diodes D2 coupled in series in the forward bias direction replace resistor R1 of bias control circuit B1 of the embodiment shown in FIG. 5, thus constituting bias control circuit B6.

In the aforementioned embodiments, circuits I1 to I5 are explained as inverters constituting a ring oscillator. The word "inverter" here indicates a circuit which logically performs an inverting operation when operated, and is not used in a narrow sense. For instance, in the embodiment shown in FIG. 12, P-channel MOS transistor P21 is coupled in parallel to P-channel MOS transistor P1 in inverter I1, P-channel MOS transistor P22 is coupled in series to P-channel MOS transistor P2 in inverter I2, P-channel Mos transistor P23 is coupled in series to P-channel MOS transistor P4 in inverter I4, and the gates of transistors P22 and P23 are supplied with start signal ST via inverter I9. Further, N-channel MOS transistor N21 is coupled in series to N-channel MOS transistor N1 in inverter I1, N-channel MOS transistor N22 is coupled in series to N-channel MOS transistor N3 in inverter I3, N-channel MOS transistor N23 is coupled in series to N-channel MOS transistor N5 in inverter I5, and the gates of transistors N32 to N23 are supplied with the start signal ST. The circuit of each stage does not appear to be an inverter; however, it functions as such when start signal ST is "1." This type of circuit is also treated as an inverter in this invention.

Figure 13:
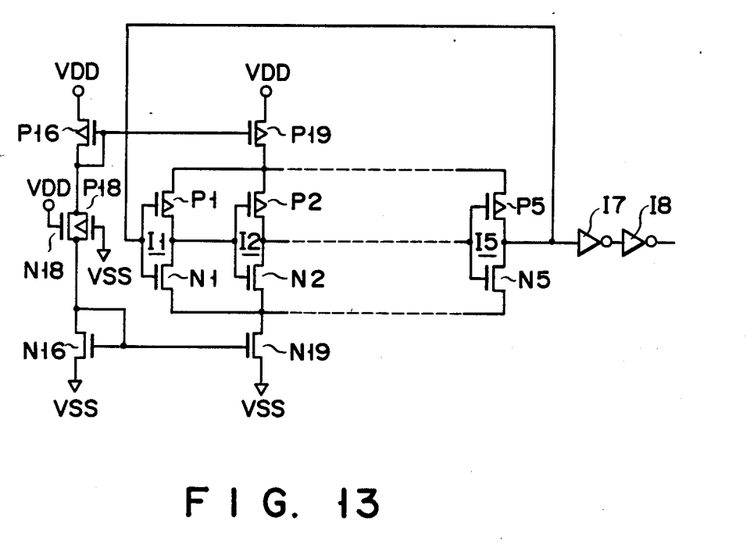
FIG. 13 is a circuit diagram of a MOS semiconductor circuit having a MOS transistor which replaces the resistor of the bias control circuit shown in FIG. 5 and is coupled in parallel therewith.

FIG. 13 is a circuit diagram showing the sixth embodiment of this invention. This embodiment uses transistors in place of polysilicon resistor R1 used in the embodiment of FIG. 5. That is, resistor R1 is replaced by P-channel MOS transistor P18 and N-channel MOS transistor N18, which have their source-drain paths coupled in parallel. The gate of transistor P18 is coupled to voltage terminal VSS, and the gate of transistor N18 is coupled to voltage terminal VDD so that both transistors are turned on. In this embodiment, a single P-channel MOS transistors P19 replaces the five P-channel MOS transistors P11 to P15, and a single N-channel MOS transistor N19 relaces the five N-channel MOS transistors N11 to N15.

To provide a predetermined current in this embodiment, transistors N18 and P18 should have a channel length of about 400 μm, thus increasing the chip-occupying area accordingly. However, transistors P16, N16, P19 and N19 need a small chip-occupying area, so that the chip-occupying area of the overall circuit is below one half of what is required for the conventional circuit. This feature applies not only to this embodiment but also all of the aforementioned embodiments, thus solving one of the conventional problems which is concerned with the chip-occupying area. In the embodiment of FIG. 5, polysilicon resistor R1 may have to be as long as 10 mm, but this can be formed under an aluminum wire via an insulating layer so that the length does not increase the chip-occupying area.

The dependency of the circuit's operation on manufacturing processes will now be described. In the conventional circuit, when the channel length or threshold voltage of a transistor varies, the current-biasing ability of the transistor varies about 30 to 50%, and so will the oscillation frequency. However, since the oscillation frequency depends very little on the current-biasing ability of the transistor in the aforementioned embodiments, the oscillation frequency does not depend on variations in manufacturing processes and is always stable. A typical variation in a polysilicon resistance is about 10%.

As the ring oscillators of the aforementioned embodiments have a stable oscillation frequency, they do not waste the refresh current like the conventional one illustrated in FIG. 1 does and therefore make possible a refresh timer with reduced dissipation power.

The embodiment of FIG. 5 has been described where current d1 equals current d2; however, these currents may have different values. More specifically, for example, currents d1 and d2 are equal to each other when transistors N16 and N11 have the same size; in general, the ratio of these currents can be set to the desired value by adjusting the channel lengths L and channel widths W of transistors N16 and N11. For instance, when the W/L ratio of transistor N16 is 50 μm/2 μm and the W/L ratio of transistor N11 is 10 μm/2 μm, d1:d2=50:10=5:1. In this case, to accurately realize this current ratio, it is recommended that transistors N16 and N11 have the same channel length, thus minimizing a deviation due to the short channel effect. To minimize a deviation due to the narrow channel effect, a plurality of transistors having the same channel width need to be coupled in parallel with one another.

Figure 14:
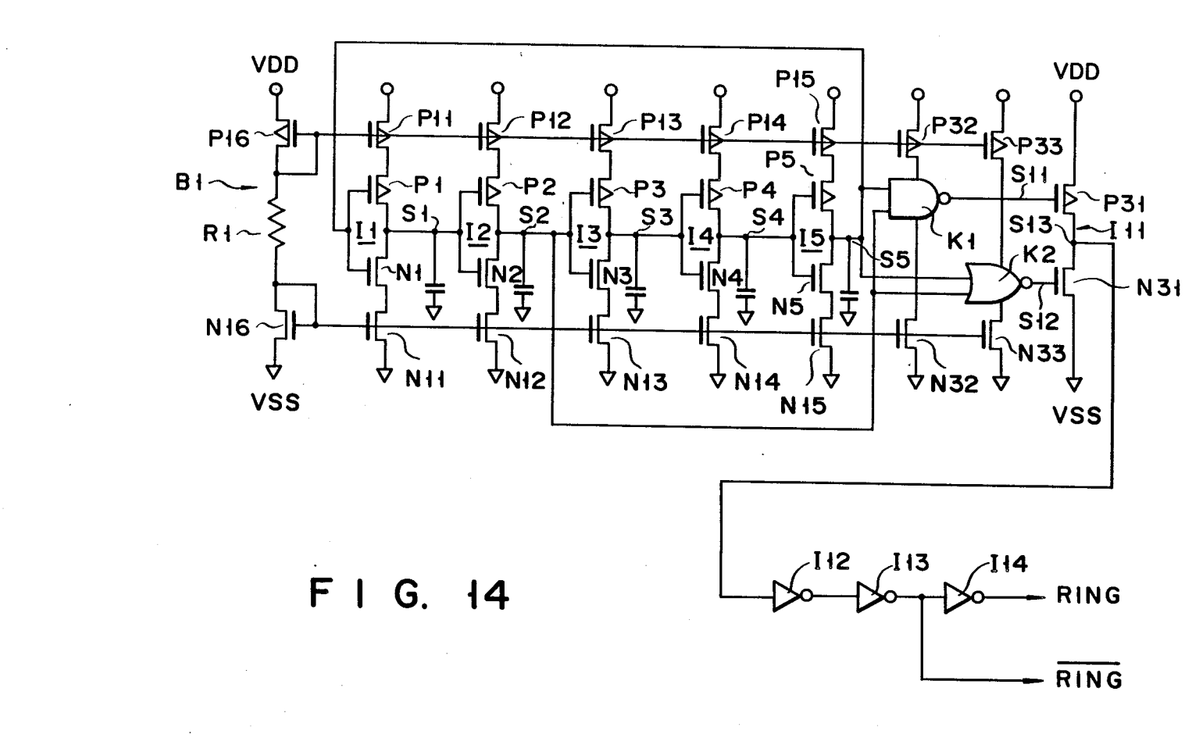
FIG. 14 is a circuit diagram of a MOS semiconductor circuit provided with a logical circuit that supplies voltage signals to a wave shaper in response to the output signals of the ring oscillator.

FIG. 14 is a circuit diagram illustrating the configuration of the seventh embodiment of this invention. This embodiment is designed to prevent the formation of a current path between voltage terminals VDD and VSS due to a gradual change in the output waveform of inverter 15, which may occur in the conventional circuit.

In this embodiment, inverters 17 and 18 serving as buffers in the embodiment of FIG. 5 are eliminated, and NAND gate K1 and NOR gate K2, both of which receive the output signals from output nodes S5 and S2 of inverters 15 and 12 as their inputs, are provided. The circuit of FIG. 14 further has P-channel MOS transistor P31, having its source coupled to voltage terminal VDD, and N-channel MOS transistor N31, which has its source coupled to voltage terminal VSS and its drain coupled to the drain of transistors P31. These transistors P31 and N31 constitute wave shaper I11, and the former transistor P31 has its gate supplied with the signal from output node S11 of NAND gate K1 and the latter one has its gate supplied with the signal from output node S12 of NOR gate K2. In order to attain the same effect as provided by inverters I1 to I5, P-channel MOS transistors P32 and P33, which have their gates coupled to the gate of P-channel MOS transistor P16 of bias control circuit B1, are coupled to NAND gate K1 and NOR gate K2, respectively, on the voltage terminal VDD sides. N-channel MOS transistors N32 and N33, which have their gates coupled to the gate of N-channel MOS transistor N16, are coupled to NAND gate K1 and NOR gate K2, respectively, on the voltage terminal VSS sides. The signal from output nodes S13 of wave shaper I11 is output as an oscillation signal $\overline{RING}$ through inverters 112 and 113, and the output signal of inverter 113 is further output as an oscillation signal RING through another inverter 114.

Figure 15:
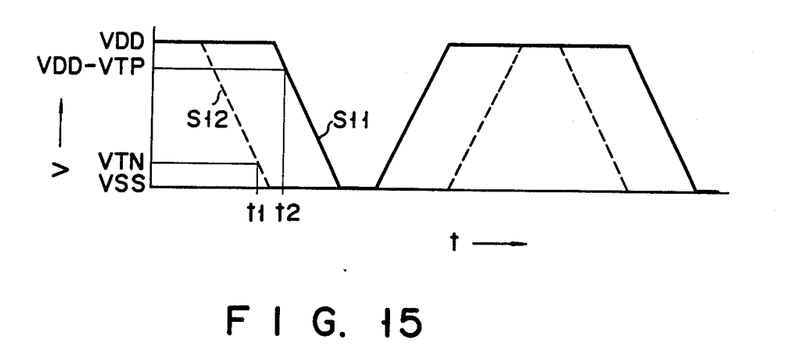
FIG. 15 is a diagram illustrating the waveforms of the voltage signals of the logical circuit of FIG. 14.

FIG. 15 shows the waveforms of the voltages at nodes S11 and S12 of the circuit shown in FIG. 14. As should be clear from these waveforms, N-channel MOS transistor N31 is turned on before t1 at which the voltage at node S12 becomes lower than threshold voltage VTN of the N-channel MOS transistors. In contrast, P-channel MOS transistor P31 is turned off before t1 since the voltage at node S11 during this period is above (VDD−VTP). Both of P-channel MOS transistor P31 and N-channel MOS transistor N31 are turned off between t1 and t2 where the voltage at node S11 becomes lower than (VDD−VTP). After t2, the voltage at node S11 is below (VDD−VTP), turning on P-channel MOS transistor P31, but the voltage at node S12 is below VTN, turning off N-channel MOS transistor N31. Therefore, transistors P31 and N31 are never simultaneously turned on at any time, thus preventing a current path between voltage terminals VDD and VSS from being formed and thereby realizing a MOS semiconductor circuit with reduced dissipation power. Although the currents generated in NAND gate K1 and NOR gate K2 flow between voltage terminals VDD and VSS, they do not raise any problem because these currents are controlled by current control transistors P32, P33, N31 and N33.

When a change in the voltage waveform of the output at node S13 of wave shaper 111 is so gentle that such a current flowing between the voltage terminals may raise a problem in inverter 112, two series-connected buffer inverters need to be provided at the preceding stage of inverter 112. To reduce the overall current flowing between the voltage terminals, it is recommended that the first-stage inverter of the two buffer inverters be constituted by a transistor having a small conductance, while the other buffer inverter be constituted by a transistor having a large conductance.

In the embodiment of FIG. 14, between t1 and t2 shown in FIG. 15, both P-channel MOS transistor P31 and N-channel MOS transistor N31 are off and the impedance between voltage terminals VDD and VSS as viewed from node S13 is high. Although this high impedance does not normally raise any crucial problem, the high impedance period between t1 and t2 should preferably be as short as possible. To realize this condition, both input nodes of each of NAND gate K1 and NOR gate K2 should be as close to each other as possible. In other words, since it is necessary that the signals coming in these two input nodes of each gate should be in phase, it is best that two inverters are present between the two input nodes, i.e., it is best that a single inverter exists between these two inverters, which respectively supply their output signals to NAND gate K1 and NOR gate K2. According to this embodiment, the signals from the output nodes of two of five inverters 11 to 15, namely 12 and 15, are used in order to obtain the waveforms at nodes S11 and S12, as shown in FIG. 15. This may be modified such that the signal from the output node of one inverter and its delayed signal are used for the same purpose. Moreover, when the high impedance of output node S13 is not allowable, the circuit of FIG. 14 may be modified as shown in FIG. 16.

Figure 16:
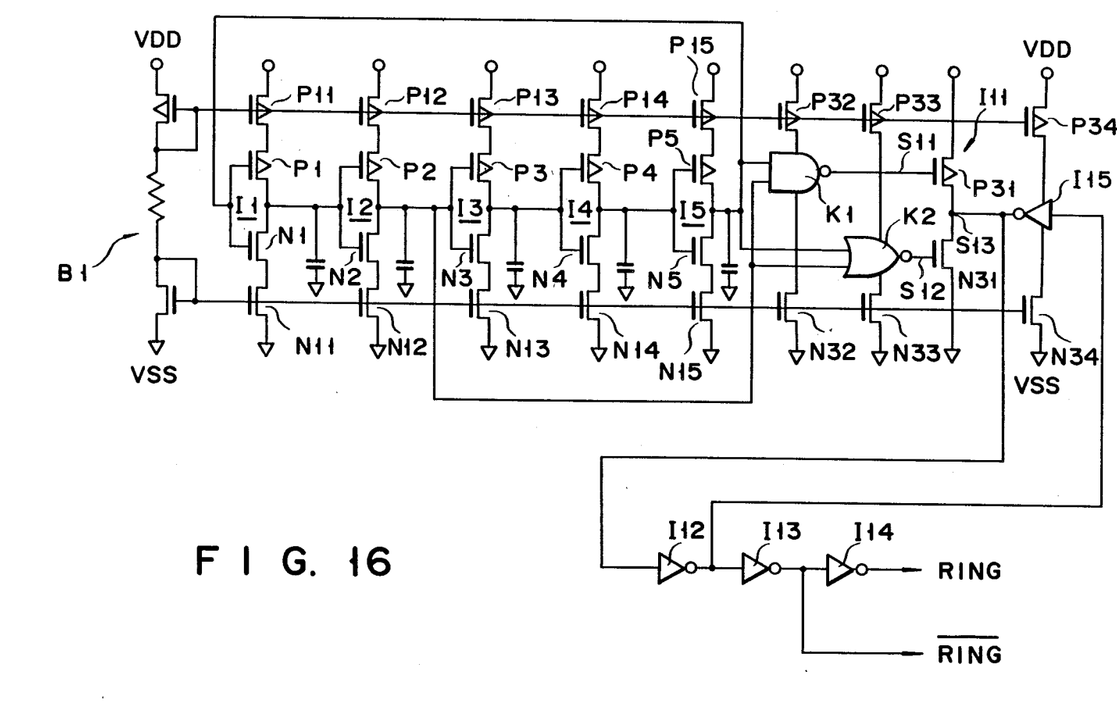
FIG. 16 is a circuit diagram of a MOS semiconductor circuit having a feedback circuit coupled to the output terminal of the wave shaper of FIG. 14.

FIG. 16 is a circuit diagram showing the eighth embodiment of this invention. The circuit of this embodiment is the circuit of FIG. 14 with an inverter I15 added. Inverter 115 receives the output signal of inverter 112 and its output is fed back to output node S13 of wave shaper 111. Like inverters 11 to 15, inverter 115 has its operation current path coupled to P-channel MOS transistor P34 and an N-channel MOS transistor N34, which control the operation current.

With the above configuration, even when the state at which the signal at output node S13 of inverter 111 is kept at either "1" or "0" by P-channel MOS transistor P312 or N-channel MOS transistor N31 changes to the state at which both of transistors P31 and N31 are turned off so that output node S13 will be set into the high impedance state, the feedback by inverter I15 keeps the state of output node S13 unchanged. That is, there is no time period in which output node S13 is in the high impedance state.

Figure 17:
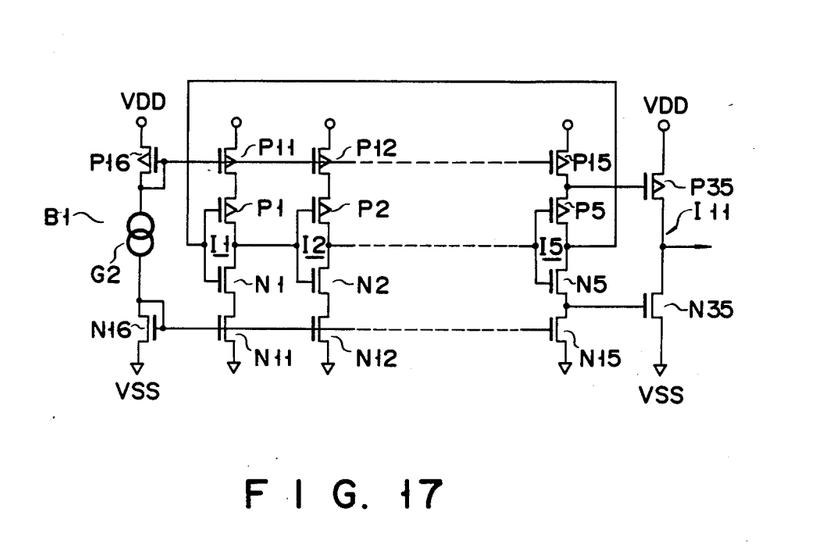
FIG. 17 is a circuit diagram of a MOS semiconductor circuit from which the logical circuit of the embodiment of FIG. 14 is eliminated.

FIG. 17 is a circuit diagram depicting the configuration of the ninth embodiment of this invention. Wave shaper I11 in this embodiment is constituted by P-channel MOS transistor P35 and N-channel MOS transistor N35. P-channel MOS transistor P35 has its source coupled to voltage terminal VDD, and N-channel MOS transistor N35 has its drain coupled to the drain of transistor P35 and its source coupled to voltage terminal VSS. The gate of transistors P35 is coupled to a connection node between transistors P15 and P5, while the gate of transistor N35 is coupled to a connection node between transistors N15 and N5. In other words, wave shaper 111 is controlled by the signal from the connection nodes of inverter 15, not from the output node thereof. Even with this configuration, there is no time period during which both of transistors P35 and N35 are simultaneously turned on. This prevents a current path between voltage terminals VDD and VSS from being formed. In this embodiment, a current source G2 serves as the current control means of bias control circuit B1.

Figure 18:
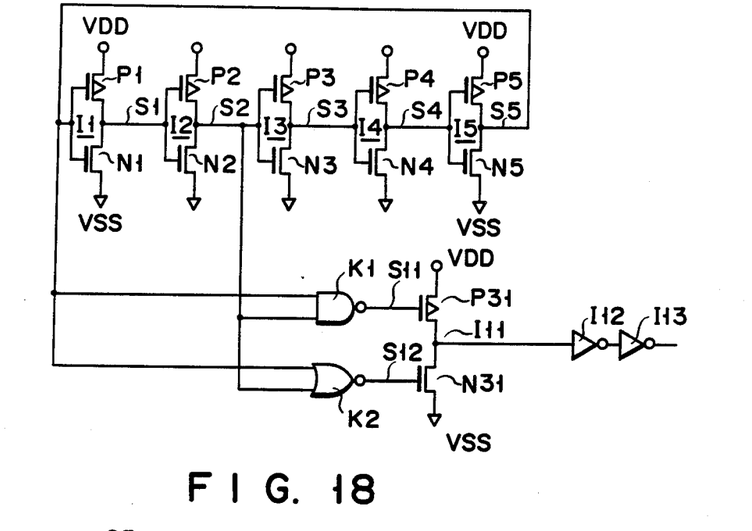
FIG. 18 is a circuit diagram of a MOS semiconductor circuit from which the bias control circuit and current control transistors of the embodiment of FIG. 14 are eliminated.

FIG. 18 is a circuit diagram illustrating the tenth embodiment of this invention. This embodiment is designed only to prevent a current path from being formed between voltage terminals VDD and VSS due to a gradual variation in the output waveform of inverter I5, which problem would occur in the conventional circuit shown in FIG. 1. The circuit of FIG. 18 is the circuit of FIG. 14 from which bias control circuit B1, current control transistors P11 to P15 and N11 to N15 of inverters 11 to 15 and current control transistors P22, P23, N22 and N23 and NAND gate K1 and NOR gate K2 are eliminated.

Figure 19A:
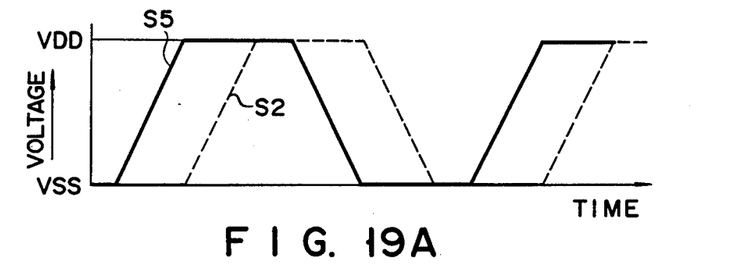
FIGS. 19A and 19B are waveform diagrams for explaining the operation of the MOS semiconductor circuit shown in FIG. 18.
Figure 19B:
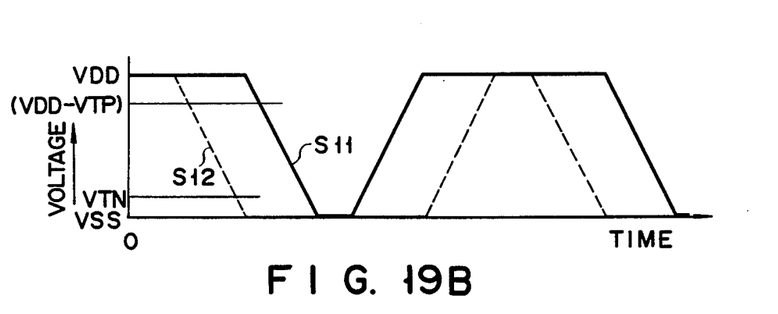

FIGS. 19A and 19B are diagrams which respectively illustrate waveforms of the signals from output nodes S2 and S5, and those from output nodes S11 and S12 of the embodiment shown in FIG. 18. As in the case of the embodiment of FIG. 14 that has been explained with reference to the waveform diagrams of FIG. 15, it should also be clear from the waveform diagrams of FIGS. 19A and 19B that in this tenth embodiment there is no time period during which P-channel MOS transistor P31 and N-channel MOS transistor N31 of wave shaper 111 are simultaneously turned on. Naturally, no current path between voltage terminals VDD and VSS is formed in wave shaper 111.

The current, which is generated by NAND gate K1 and NOR gate K2 and flows between the two voltage terminals in wave shaper T11, can be reduced to a negligible level when these gates are constituted by transistors having a small conductance.

Figure 20:
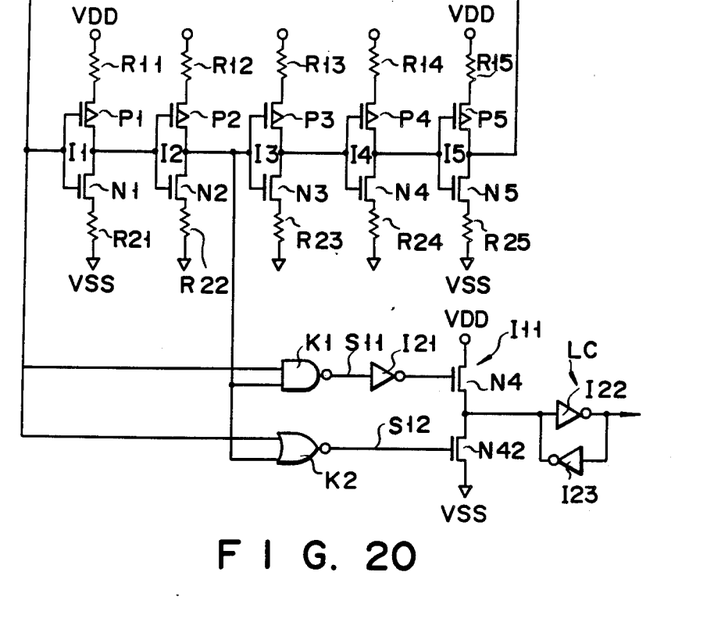
FIG. 20 is a circuit diagram of a MOS semiconductor circuit having operation-current control resistors coupled to a plurality of inverters constituting the ring oscillator of the embodiment shown in FIG. 18.

FIG. 20 is a circuit diagram showing the configuration of the eleventh embodiment of this invention. This embodiment is a modification of the tenth embodiment shown in FIG. 18, and the modified sections are as follows. Current control resistors R11 to R15 are additionally provided between voltage terminal VDD and P-channel MOS transistors P1 to P5 of inverters 11 to 15, respectively, and current control resistors R21 to R25 are also additionally inserted between voltage terminal VSS and N-channel MOS transistors N1 to N5. Further, in order to constitute wave shaper I11 using two N-channel MOS transistors N41 and N42, an inverter I21 is provided between output node S11 of NAND gate K1 and transistor N41. In addition, a latch circuit LC having two parallel-connected inverters 122 and 123 is coupled to the output node of wave shaper 111.

Figure 21:
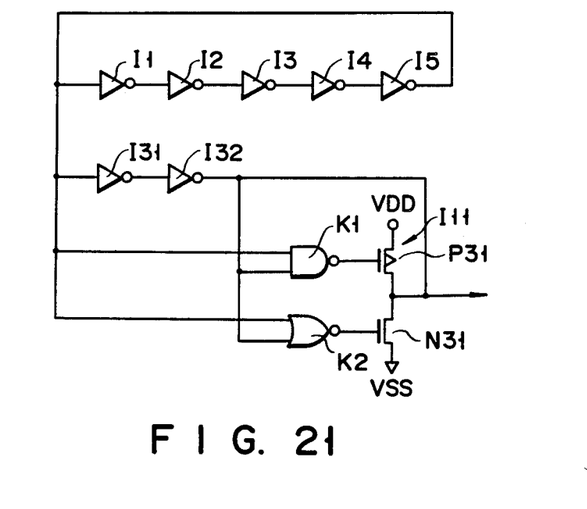
FIG. 21 is a circuit diagram showing a modification of the MOS semiconductor circuit of FIG. 18.

FIG. 21 is a circuit diagram depicting the configuration of the twelfth embodiment of this invention. In the embodiment of FIG. 18, NAND gate K1 and NOR gate K2 receive the signals from the output nodes (S5 and S2) of two (15 and 12) of five inverters 11 to 15. This may be modified such that the signal from the output node of one inverter and its delayed signal are supplied to these gates. According to the embodiment of FIG. 21, therefore, the output signal of inverter 15 and a signal obtained by delaying this output signal by two series connected inverters 131 and 132, are supplied to NAND gate K1 and NOR gate K2.

Figure 22:
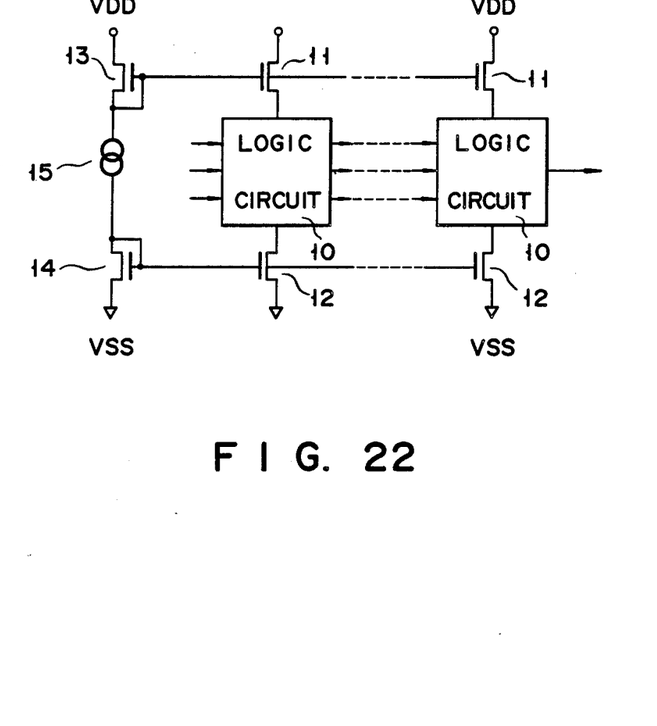
FIG. 22 is a circuit diagram of a MOS semiconductor circuit according to another embodiment of this invention.

Although this invention has been described with reference to a ring oscillator which is one application of this invention, this invention can apply to other semiconductor circuits as well. The general concept of this invention is illustrated in FIG. 22. The MOS semiconductor circuit of FIG. 22 comprises logical circuits 10, current control P-channel MOS transistors 11 respectively provided between voltage terminal VDD and the source voltage nodes of these logical circuits, current control N-channel MOS transistors 12 respectively provided between voltage terminal VSS and the reference voltage node of logical circuits 10, N-channel MOS transistor 16, which has its gate and drain short-circuited and constitutes a current mirror circuit in association with the individual transistors 12, and current control means 15 expressed as a current source. This semiconductor circuit can be easily designed to have a specific temperature characteristic or sourcevoltage dependency.

When this invention is applied to a ring oscillator as per the aforementioned embodiments, inverter 11 to 15 can have the same layout, ensuring that the current control transistors are formed with less variation therein. In a ring oscillator, since the falling and rising of signals occur at mutually close timings, the total operation current will not greatly vary. As a result, the noise originating from a variation in the operation current can be considerably suppressed, thus providing a stable oscillating operation.

What is claimed is:

1. A MOS semiconductor circuit comprising:
   first and second voltage terminals;
   cascade-connected logical circuits;
   a first MOS transistor circuit having at least one first MOS transistor coupled between said first voltage terminal and the output node of one of said logical circuits;
   a second MOS transistor having the same conductivity type as said first MOS transistor and having a gate coupled to a gate of said first MOS transistor and a drain coupled to said gate of said second MOS transistor; and
   a current control circuit including a polysilicon resistor coupled to said drain of said second MOS transistor, for causing a predetermined current to flow through the source-drain path of said second MOS transistor.

2. The MOS semiconductor circuit according to claim 1, wherein said first MOS transistor circuit has a plurality of first MOS transistors respectively coupled between said first voltage terminal and said output nodes of said logical circuits.

3. The MOS semiconductor circuit according to claim 1, wherein said MOS semiconductor circuit further comprises a second MOS transistor circuit having at least one third MOS transistor coupled between said second voltage terminal and said output nodes of said logical circuits; and
   wherein said current control circuit has a fourth MOS transistor having the same conductivity type as said third MOS transistor and having a gate coupled to a gate of said third MOS transistor and a drain coupled to said gate of said fourth MOS transistor, and a current source coupled between drains of said second and fourth MOS transistor to provide a predetermined current between said source and drain of said fourth MOS transistor.

4. The MOS semiconductor circuit according to claim 3, wherein said current control circuit comprises a polysilicon resistor.

5. The MOS semiconductor circuit according to claim 3, wherein said second MOS transistor circuit has a plurality of fifth MOS transistors respectively coupled between said second voltage terminal and said output nodes of said logical circuits.

6. The MOS semiconductor circuit according to claim 1, wherein said first and second MOS transistors have the same channel length.

7. The MOS semiconductor circuit according to claim 1, wherein said first and second MOS transistors have the same channel width.

8. The MOS semiconductor circuit according to claim 1, wherein each of said logical circuits comprises an N-channel MOS inverter.

9. The MOS semiconductor circuit according to claim 1, further comprising capacitors respectively coupled between said second voltage terminal and output nodes of said logical circuits.

10. A MOS semiconductor circuit comprising:
first and second voltage terminals;
cascade-connected logical circuits;
a first MOS transistor circuit having at least one first MOS transistor coupled between said first voltage terminal and one of the output nodes of said logical circuits;
a second MOS transistor having the same conductivity type as said first MOS transistor and having a gate coupled to a gate of said first MOS transistor and a drain coupled to said gate of said second MOS transistor; and
a current control circuit, coupled to said drain of said second MOS transistor, for causing a predetermined current to flow through the source-drain path of said second MOS transistor; wherein said logical circuits comprise an inverter circuit including at least two cascade-connected inverters, NOR and NAND gates for receiving in-phase signals from both input and output terminals of said inverter circuit, and a wave shaping circuit for generating output signals, corresponding to said output signals from said inverter circuit, in response to output signals of said NOR and NAND gates.

11. A MOS semiconductor circuit comprising:
first and second voltage terminals;
cascade-connected inverters, an output terminal of the last stage of said inverters being coupled to an input terminal of the first stage of said inverters, thereby constituting a ring oscillator;
a first MOS transistor circuit having a least one first MOS transistor coupled between said first voltage terminal and the output node of one of said inverters;
a second MOS transistor having the same conductivity type as said first MOS transistor and having a gate coupled to a gate of said first MOS transistor and drain coupled to said gate of said second MOS transistor;
a current control circuit, coupled ot said drain of said second MOS transistor, for causing a predetermined current to flow through the source-drain path of said second MOS transistor;
NOR and NAND gates for receiving in-phase output signals of two of said inverters; and
a wave shaping circuit for generating output signals, corresponding to said output signals of said two inverters, in response to output signals of said NOR and NAND gates.

12. The MOS semiconductor circuit according to claim 11, wherein said wave shaping circuit has a P-channel MOS transistor having a gate coupled to an output terminal of said NAND gate, and an N-channel MOS transistor having a gate coupled to an output terminal of said NOR gate, said P-channel MOS transistor and said N-channel MOS transistor being coupled in series between said first and second voltage terminals.

13. The MOS semiconductor circuit according to claim 12, further comprising feedback means, coupled to an output terminal of said wave shaping circuit, for stabilizing a potential of said output terminal of said wave shaping circuit.

14. A MOS semiconductor circuit comprising:
a ring oscillator comprising an odd number of inverters;
a plurality of NOR and NAND gates for receiving in-phase output signals from two of said inverters; and
a wave shaping circuit for generating output signals, corresponding to said output signals of said two inverters, in response to output signals of said NOR and NAND gates;
wherein said wave shaping circuit has a series-connected P-channel MOS transistor and an N-channel MOS transistor, said P-channel MOS transistor having a gate coupled to an output terminal of said NAND gate, and said N-channel MOS transistor having a gate couple to an output terminal of said NOR gate.

15. A MOS semiconductor circuit comprising:
first and second voltage terminals;
cascade-connected logical circuits;
a first MOS transistor circuit having at least one first MOS transistor coupled between said first voltage terminal and the output node of one of said logical circuits;
a second MOS transistor having the same conductivity type as said first MOS transistor and having a gate coupled to a gate of said first MOS transistor and a drain coupled to said gate of said second MOS transistor;
a second MOS transistor circuit having at least one third MOS transistor coupled between said second voltage terminal and said output nodes of said logical circuits;
a fourth MOS transistor having the same conductivity type as said third MOS transistor and having a gate coupled to a gate of said third MOS transistor and a drain coupled to said gate of said fourth MOS transistor; and
a current control circuit having a current source coupled between said drains of said second and fourth MOS transistors.

16. The MOS semiconductor circuit according to claim 15, wherein said current control circuit has a plurality of series-connected diodes.

17. The MOS semiconductor circuit according to claim 15, wherein said current source has parallel-connected fifth MOS transistors of a different conductivity type.

18. The MOS semiconductor circuit according to claim 15, wherein said second MOS transistor circuit has a plurality of fifth MOS transistors respectively coupled between said second voltage terminal and said output nodes of said logical circuits.

19. A MOS semiconductor circuit comprising:
first and second voltage terminals;
cascade-connected logical circuits;
a first MOS transistor circuit having at least one first MOS transistor coupled between said first voltage terminal and the output node of one of said logical circuits;
a second MOS transistor having the same conductivity type as said first MOS transistor and having a gate coupled to a gate of said first MOS transistor and a drain coupled to said gate of said second MOS transistor; and
a current control circuit including a diffusion resistor coupled to said drain of said second MOS transistor, for causing a predetermined current to flow through the source-drain path of said second MOS transistor.

20. The MOS semiconductor circuit according to claim 19, wherein said current control circuit has a diode coupled in parallel with said resistor.

* * * * *